(12) United States Patent
Nakagawa et al.

(10) Patent No.: US 10,000,616 B2
(45) Date of Patent: Jun. 19, 2018

(54) WEATHERABLE SHEET FOR SOLAR CELL MODULE, PRODUCT OBTAINED USING THE SHEET, AND PROCESS FOR PRODUCING THE WEATHERABLE SHEET FOR SOLAR CELL MODULE

(75) Inventors: Hideto Nakagawa, Settsu (JP); Kenji Goboh, Settsu (JP); Kazuko Aoki, Settsu (JP); Takayuki Araki, Settsu (JP); Hiroshi Torii, Shanghai (CN); Yoshihisa Yamamoto, Changshu (CN); Eiji Fujita, Orangeburg, NY (US)

(73) Assignee: DAIKIN INDUSTRIES, LTD., Osaka (JP)

( * ) Notice: Subject to any disclaimer, the term of this patent is extended or adjusted under 35 U.S.C. 154(b) by 915 days.

(21) Appl. No.: 13/522,098

(22) PCT Filed: Jan. 13, 2011

(86) PCT No.: PCT/JP2011/050422
§ 371 (c)(1),
(2), (4) Date: Jul. 13, 2012

(87) PCT Pub. No.: WO2011/087046
PCT Pub. Date: Jul. 21, 2011

(65) Prior Publication Data
US 2012/0298196 A1    Nov. 29, 2012

(30) Foreign Application Priority Data
Jan. 14, 2010    (JP) .................................. 2010-006254

(51) Int. Cl.
*B05D 3/02* (2006.01)
*B32B 27/00* (2006.01)
(Continued)

(52) U.S. Cl.
CPC .......... *C08J 7/047* (2013.01); *B32B 17/10788* (2013.01); *H01L 31/049* (2014.12);
(Continued)

(58) Field of Classification Search
None
See application file for complete search history.

(56) References Cited

U.S. PATENT DOCUMENTS 6,075,110 A * 6/2000 Mohri .................. C09D 183/02
106/287.16
2011/0073167 A1    3/2011 Ozaki et al.

FOREIGN PATENT DOCUMENTS

CN    101290950 A    10/2008
EP    491357 A1 *  6/1992
(Continued)

OTHER PUBLICATIONS

Young Sun, Physical Property of Coronate HX, Young Sun Chemtrade Co., retrieved Apr. 17, 2015, p. 1.*
(Continued)

*Primary Examiner* — Callie Shosho
*Assistant Examiner* — Patrick N English
(74) *Attorney, Agent, or Firm* — Sughrue Mion, PLLC (57) ABSTRACT

The present invention provides a weather-resistant sheet for a solar cell module, which has better adhesion to a water impermeable sheet, better blocking resistance against the water impermeable sheet, and better adhesion to EVA that is a sealant; a weather-resistant sheet for a solar cell module in which a cured coating film layer thereof can suppress UV transmission significantly; a product including the sheet; and a process for producing the sheet. The weather-resistant sheet for a solar cell module includes, on a water impermeable sheet, a cured coating film layer made of a crosslinked product of a coating composition that includes a hydroxyl
(Continued)

group-containing fluoropolymer, wherein in a pressure-resistance test performed when a crosslinking degree of the cured coating film layer is 80 to 99%, the cured coating film layer and the water impermeable sheet without a cured coating film layer formed thereon are not adhered to each other after a load has been applied to the cured coating film layer and the water impermeable sheet being stacked.

10 Claims, 3 Drawing Sheets

(51) Int. Cl.
    *B32B 27/20*     (2006.01)
    *C09D 127/18*     (2006.01)
    *H01L 31/0203*     (2014.01)
    *H01L 31/0216*     (2014.01)
    *C08J 7/04*     (2006.01)
    *B32B 17/10*     (2006.01)
    *H01L 31/049*     (2014.01)
(52) U.S. Cl.
    CPC ........ *C08J 2367/02* (2013.01); *C08J 2427/12* (2013.01); *Y02E 10/50* (2013.01); *Y10T 428/3154* (2015.04); *Y10T 428/31544* (2015.04)

(56) References Cited

FOREIGN PATENT DOCUMENTS

| | | |
|---|---|---|
| EP | 1 938 967 A1 | 7/2008 |
| EP | 1938967 A1 * | 7/2008 |
| EP | 2 426 729 A1 | 3/2012 |
| EP | 2 584 613 A1 | 4/2013 |
| JP | 7-176775 A | 7/1995 |
| JP | 2004-214342 A | 7/2004 |
| JP | 2007-35694 A | 2/2007 |
| WO | 2007/010706 A1 | 1/2007 |
| WO | 2007010706 A1 | 1/2007 |
| WO | 2009/142259 A1 | 11/2009 |

OTHER PUBLICATIONS

Ciullo, Industrial Minerals and Their Uses: A Handbook and Formulary, William Andrew, 1996, p. 329.*

Tri-Iso, Coronate, Aliphatic Isocyanates, retrieved Nov. 2, 2017, p. 1.*

Extended European Search Report dated Feb. 7, 2014 for EP Appln. No. 11732916.9.

International Search Report for PCT/JP2011/050422 dated Mar. 8, 2011.

* cited by examiner

WEATHERABLE SHEET FOR SOLAR CELL MODULE, PRODUCT OBTAINED USING THE SHEET, AND PROCESS FOR PRODUCING THE WEATHERABLE SHEET FOR SOLAR CELL MODULE

CROSS REFERENCE TO RELATED APPLICATIONS

This application is a National Stage of International Application No. PCT/JP2011/050422 filed Jan. 13, 2011, claiming priority based on Japanese Patent Application No. 2010-006254 filed Jan. 14, 2010, the contents of all of which are incorporated herein by reference in their entirety.

TECHNICAL FIELD

The present invention relates to a weather-resistant sheet for a solar cell module, a product including the sheet, and a process for producing the weather-resistant sheet for a solar cell module. More specifically, the present invention relates to a weather-resistant sheet for a solar cell module that can prevent blocking in a preparation step of rolling, form a cured coating film layer having excellent adhesion to other layers (e.g., sealant layer) constituting the solar cell module, and greatly suppress UV transmission; a product including the sheet; and a process for producing the weather-resistant sheet for a solar cell module.

BACKGROUND ART

Figure 6:
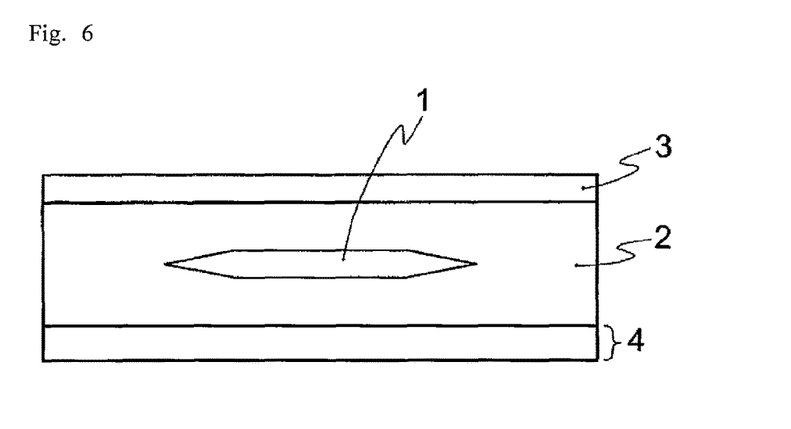
FIG. 6 is a schematic cross-sectional view of a conventional solar cell module.

As illustrated in FIG. 6, solar cell modules usually have a structure in which a solar cell 1 is sealed in a sealant layer 2, and the sealant layer 2 is sandwiched by a surface layer 3 made of a material such as glass or a transparent resin and a weather-resistant sheet 4. Here, the sealant used is an ethylene/vinyl acetate copolymer (EVA).

The weather-resistant sheet 4 in a solar cell module is provided for an increase in the mechanical strength of the module and for prevention of moisture (vapor) entry into the sealant layer 2.

Figure 7:
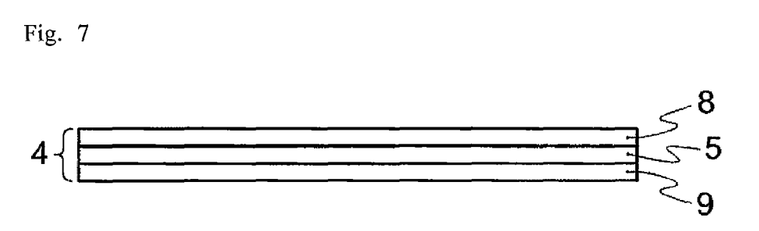
FIG. 7 is a schematic cross-sectional view of a weather-resistant sheet of the conventional solar cell module.

The weather-resistant sheet 4 includes, as illustrated in FIG. 7, a water impermeable sheet 5 for providing a vapor barrier property, and a resin sheet 8 that is attached to one surface of the water impermeable sheet 5. Usually, a resin sheet 9 is attached to the other surface of the water impermeable sheet 5.

The water impermeable sheet 5 is produced from a material such as a Si-deposited polyester (Si-deposited PET) and a metal (e.g., aluminum, stainless steel) which are excellent in water impermeability, and the sheet usually has a thickness of 10 to 20 μm.

The resin sheets 8 and 9 are desired to have properties such as weather resistance, electrical insulation, fire retardancy, and a design property, and are sheets produced from polyvinyl fluoride polymer (PVF). A polyethylene sheet may be used as the resin sheet 8 which is on the sealant layer 2 side.

These resin sheets, however, are usually required to have a thickness of 20 to 100 μm in order to satisfy the required properties such as weather resistance and electrical insulation, which leads to an increase in the weight. Hence, the sheets are desired to be further reduced in weight.

In this context, Patent Document 1 and Patent Document 2, for example, have proposed formation of a similar layer with use of a resin coating material instead of a resin sheet.

In Patent Document 1, an epoxy resin coating material is used as a resin coating material. However, epoxy resin does not have sufficient weather resistance, and thus has not been practically used.

In Patent Document 2, a weather-resistant sheet is proposed which has a double-layer structure formed by applying a PVdF coating material, produced by mixing PVdF free from functional groups with a specific amount of tetraalkoxysilane or a partial hydrolysate thereof, to a metal substrate (water impermeable sheet). Since PVdF in the PVdF coating material does not have functional groups, the PVdF coating material has low adhesion to EVA (sealant) when used alone. The adhesion is increased in Patent Document 2 by mixing a specific amount of tetraalkoxysilane or a partial hydrolysate thereof in the coating material, and applying tetraalkoxysilane or a partial hydrolysate thereof to the interface between the coating material and EVA. However, the structure does not contribute to an increase in the adhesion between the PVdF coating film and the metal substrate because the tetraalkoxysilane or a partial hydrolysate thereof is unevenly distributed in the interface with EVA. Also, since PVdF is crystalline and does not have functional groups, the PVdF coating material is required to be heated at 200° C. to 300° C. for 20 to 120 seconds to be formed into a coating film. For this reason, it has been difficult to use PVdF on a water impermeable sheet other than metal ones.

Patent Document 3 has proposed a weather-resistant sheet for a solar cell which solves the above problem, i.e., a weather-resistant sheet having excellent adhesion to a water impermeable sheet regardless of the type of the water impermeable sheet, in which a cured coating film layer of a hydroxyl group-containing fluoropolymer coating composition is formed on at least one surface of a water impermeable sheet.

Figure 8:
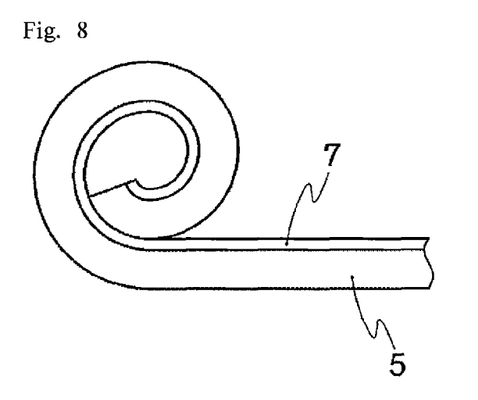
FIG. 8 is an explanatory view for describing adhesion between a partially cured coating film layer and a water impermeable sheet having no cured coating film layer formed thereon in the weather-resistant sheet of the present invention.

Here, the actual production steps include a step of rolling a water impermeable sheet having a coating film layer formed thereon (a rolling step) for an increase in the production efficiency. If the partially cured coating film has tackiness in the rolling step, the back surface of the rolled water impermeable sheet and the surface of the coating film layer may cause a problem of blocking as illustrated in FIG. 8. The reference number 5 indicates a water impermeable sheet, and the reference number 7 indicates a coating film.

In the case of the hydroxyl group-containing fluoropolymer coating material of Patent Document 3, a weather-resistant sheet consisting of a water impermeable sheet and a coating film layer is dried at 80° C. for 30 minutes, and the adhesion between the coating film and the sheet is evaluated. Here, the adhesion and the blocking resistance between the back surface of the water impermeable sheet and the surface of the coating film layer in the rolled state can be further improved. Also, adhesion evaluation is made on a sample produced by disposing an EVA resin sheet on the surface of the coating film of the weather-resistant sheet and pressing the sheets, and the adhesion here can also be further improved.

Patent Document 1: JP 7-176775 A
Patent Document 2: JP 2004-214342 A
Patent Document 3: JP 2007-035694 A

SUMMARY OF THE INVENTION

The present invention aims to provide a coating composition for a weather-resistant sheet of a solar cell module, which has better adhesion to a water impermeable sheet and better blocking resistance against the water impermeable sheet than those achieved in Patent Document 3, and better adhesion to EVA that is a sealant; a weather-resistant sheet for a solar cell module which is produced from the coating composition; a product including the sheet; and a process for producing the sheet.

The present invention also aims to provide a coating composition for a weather-resistant sheet of a solar cell module in which the cured coating film layer of the weather-resistant sheet for a solar cell module can control UV transmission greatly; a weather-resistant sheet for a solar cell module which is produced from the coating composition; a product including the sheet; and a process for producing the sheet.

Other aims will be described according to specific embodiments.

That is, one aspect of the present invention is a weather-resistant sheet for a solar cell module, including, on a water impermeable sheet, a cured coating film layer made of a crosslinked product of a coating composition that includes a hydroxyl group-containing fluoropolymer, wherein in a pressure-resistance test performed based on JIS K 5600-3-5 when a crosslinking degree of the cured coating film layer is 80 to 99%, the cured coating film layer having a crosslinking degree of 80 to 99% (hereinafter, the uncured state with a crosslinking degree of 80 to 99% is referred to as partially cured state) and the water impermeable sheet without a cured coating film layer formed thereon are not adhered to each other after a load of 0.08 MPa has been applied for 24 hours to the cured coating film layer and the water impermeable sheet being stacked.

Another aspect of the present invention is a weather-resistant sheet for a solar cell module, including, on a water impermeable sheet, a cured coating film layer made of a crosslinked product of a coating composition that includes a hydroxyl group-containing fluoropolymer, the cured coating film layer having a pencil hardness of not lower than B on the surface thereof when a crosslinking degree of the cured coating film layer is 80 to 99%.

The coating composition preferably contains a hydroxyl group-containing fluoropolymer, an isocyanate curing agent, and an organic metal curing aid.

The coating composition preferably contains 0.001 to 10 mmol of the organic metal curing aid per mole of a —NCO group of the isocyanate curing agent.

The coating composition preferably includes a hydroxyl group-containing fluoropolymer, an isocyanate curing agent, and a pigment.

The coating composition preferably includes 0.84 to 3 parts by mass of the pigment per part by mass of the hydroxyl group-containing fluoropolymer.

The weather-resistant sheet of the present invention may have a double-layer structure in which a cured coating film layer of a hydroxyl group-containing fluoropolymer coating material is formed only on one surface of a water impermeable sheet; a three-layer structure in which a cured coating film layer of a hydroxyl group-containing fluoropolymer coating material is formed on each surface of a water impermeable sheet; or a three-layer structure in which a cured coating film layer of a hydroxyl group-containing fluoropolymer coating material is formed on one surface of the water impermeable sheet, and a cured coating film layer of a fluoropolymer coating composition free from curable functional groups, a fluoropolymer sheet, a polyester sheet, or a coating film of a polyester coating material (hereinafter, also referred to as "another sheet or coating film") is formed on the other surface. Here, one or two or more conventionally known interlayers may be disposed between the water impermeable sheet and the cured coating film layer and/or another sheet or coating film, for a further increase in the adhesion, an increase in the concealing property, and a decrease in the water vapor permeability. A representative example of such an interlayer is a primer layer.

Yet another aspect of the present invention is a solar cell module including a laminate structure of a sealant layer that includes an ethylene/vinyl acetate copolymer and has a solar cell sealed therein, and the above weather-resistant sheet, the solar cell module including the cured coating film layer between the sealant layer and the water impermeable sheet of the weather-resistant sheet.

Yet another aspect of the present invention is a solar cell module including a laminate structure of a sealant layer that includes an ethylene/vinyl acetate copolymer and has a solar cell sealed therein, and the above weather-resistant sheet, the solar cell module including the water impermeable sheet between the sealant layer and the cured coating film layer of the weather-resistant sheet.

Yet another aspect of the present invention is a solar cell panel including the above solar cell module.

Yet another aspect of the present invention is a coating composition for a weather-resistant sheet of a solar cell module, including a hydroxyl group-containing fluoropolymer, an isocyanate curing agent, and an organic metal curing aid, wherein the coating composition contains 0.001 to 10 mmol of the organic metal curing aid per mole of a —NCO group of the isocyanate curing agent.

Yet another aspect of the present invention is a coating composition for a weather-resistant sheet of a solar cell module, including a hydroxyl group-containing fluoropolymer, an isocyanate curing agent, and a pigment, wherein the coating composition contains 0.84 to 3 parts by mass of the pigment per part by mass of the hydroxyl group-containing fluoropolymer.

Yet another aspect of the present invention is a process for producing a weather-resistant sheet for a solar cell module, including: an application step of applying a coating composition, containing a hydroxyl group-containing fluoropolymer, to a surface of a water impermeable sheet to form an uncured coating film layer; a curing and laminating step of curing the uncured coating film layer to a crosslinking degree in the range of 80 to 99% to form a laminate of the water impermeable sheet and a cured coating film; a rolling step of rolling the laminate; and an aging step of completely curing the cured coating film of the rolled laminate, wherein in a pressure-resistance test performed based on JIS K 5600-3-5, a back surface of the water impermeable sheet and a free surface of the cured coating film having a crosslinking degree of 80 to 99% which have come into contact with each other in the rolling step of rolling the laminate are not adhered to each other after a load of 0.08 MPa has been applied to the laminate for 24 hours.

It is preferable that the coating composition contain a hydroxyl group-containing fluoropolymer, an isocyanate curing agent, and an organic metal curing aid, and the coating composition include 0.001 to 10 mmol of the organic metal curing aid per mole of a —NCO group of the isocyanate curing agent.

It is preferable that the coating composition contain a hydroxyl group-containing fluoropolymer, an isocyanate curing agent, and a pigment, and the coating composition include 0.84 to 3 parts by mass of the pigment per part by mass of the hydroxyl group-containing fluoropolymer.

The present invention enables to provide a coating composition for a weather-resistant sheet of a solar cell module, which has better adhesion to a water impermeable sheet, better blocking resistance against the water impermeable sheet, and better adhesion to EVA that is a sealant than conventional ones; a weather-resistant sheet for a solar cell module which is produced from the coating composition; a product including the sheet; and a process for producing the sheet.

The present invention also enables to provide a coating composition for a weather-resistant sheet of a solar cell module, the weather-resistant sheet having a cured coating film layer that can suppress UV transmission significantly; a weather-resistant sheet for a solar cell module which is produced from the coating composition; a product including the sheet; and a process for producing the sheet.

Other effects will be described as needed in the specific embodiments.

MODES FOR CARRYING OUT THE INVENTION

The process for producing a weather-resistant sheet for a solar cell module according to the present invention includes an application step of applying a coating composition, containing a hydroxyl group-containing fluoropolymer, to a surface of a water impermeable sheet to form an uncured coating film layer; a curing and laminating step of curing the uncured coating film layer to a crosslinking degree in the range of 80 to 99% to form a laminate of the water impermeable sheet and a cured coating film; a rolling step of rolling the laminate; and an aging step of completely curing the cured coating film of the rolled laminate, wherein in a pressure-resistance test performed based on JIS K 5600-3-5, a back surface of the water impermeable sheet and a free surface of the cured coating film having a crosslinking degree of 80 to 99% which have come into contact with each other in the rolling step of rolling the laminate are not adhered to each other after a load of 0.08 MPa has been applied to the laminate for 24 hours.

The application step is described. The application step is a step of applying a coating composition, containing a hydroxyl group-containing fluoropolymer, to the surface of a water impermeable sheet to form an uncured coating film layer.

Examples of the hydroxyl group-containing fluoropolymer include a polymer produced by introducing a hydroxyl group to a fluoropolymer. Examples of the fluoropolymer include a resin polymer having a definite melting point, an elastomeric polymer exhibiting rubber elasticity, and a thermoplastic elastomeric polymer which has properties between these polymers.

A hydroxyl group is usually introduced into a fluoropolymer by copolymerization with hydroxyl group-containing monomers.

Examples of the hydroxyl group-containing monomers include, but not limited to, the following compounds.

Examples of the hydroxyl group-containing monomers include hydroxyl group-containing vinyl ethers such as 2-hydroxyethyl vinyl ether, 3-hydroxypropyl vinyl ether, 2-hydroxypropyl vinyl ether, 2-hydroxy-2-methylpropyl vinyl ether, 4-hydroxybutyl vinyl ether, 4-hydroxy-2-methylbutyl vinyl ether, 5-hydroxypentyl vinyl ether, and 6-hydroxyhexyl vinyl ether; and hydroxyl group-containing allyl ethers such as 2-hydroxyethyl allyl ether, 4-hydroxybutyl allyl ether, and glycerol monoallyl ether. Among these, hydroxyl group-containing vinyl ethers, particularly 4-hydroxybutyl vinyl ether and 2-hydroxyethyl vinyl ether, are preferred in terms of excellent polymerization reactivity and the curability of functional groups.

Other examples of the hydroxyl group-containing monomers include hydroxy alkyl esters of a (meth)acrylic acid, such as 2-hydroxyethyl acrylate and 2-hydroxyethyl methacrylate.

Examples of the fluoropolymer into which a hydroxyl group is introduced include the following compounds in terms of the constitutional units.

(1) Perfluoroolefin Polymers Mainly Including Perfluoroolefin Units

Specific examples thereof include a homopolymer of tetrafluoroethylene (TFE), a copolymer of TFE and a compound such as hexafluoropropylene (HFP) and perfluoro (alkyl vinyl ether) (PAVE), and a copolymer of these compounds and other monomer(s) copolymerizable with these compounds.

Examples of the other copolymerizable monomer(s) include, but not limited to, carboxylic acid vinyl esters such as vinyl acetate, vinyl propionate, vinyl butyrate, vinyl isobutyrate, vinyl pivalate, vinyl caproate, vinyl versatate, vinyl laurate, vinyl stearate, vinyl cyclohexylcarboxylate, vinyl benzoate, and vinyl para-t-butyl-benzoate; alkyl vinyl ethers such as methyl vinyl ether, ethyl vinyl ether, butyl vinyl ether, and cyclohexyl vinyl ether; non-fluoroolefins such as ethylene, propylene, n-butene, and isobutene; and fluoromonomers such as vinylidene fluoride (VdF), chlorotrifluoroethylene (CTFE), vinyl fluoride (VF), and fluorovinyl ether.

Among these, TFE polymers mainly including TFE are preferred in terms of excellent pigment dispersibility, weather resistance, copolymerizability, and chemical resistance.

Specific examples of the hydroxyl group-containing perfluoroolefin polymer include copolymers of TFE/isobutylene/hydroxybutyl vinyl ether/other monomer(s), copolymers of TFE/vinyl versatate/hydroxybutyl vinyl ether/other monomer(s), and copolymers of TFE/VdF/hydroxybutyl vinyl ether/other monomer(s). Particularly, copolymers of TFE/isobutylene/hydroxybutyl vinyl ether/other monomer (s) and copolymers of TFE/vinyl versatate/hydroxybutyl vinyl ether/other monomer(s) are preferred.

Examples of curable TFE polymer coating materials include ZEFFLE GK series produced by Daikin Industries, LTD.

(2) CTFE Polymers Mainly Including Chlorotrifluoroethylene (CTFE) Units

Specific examples thereof include copolymers of CTFE/hydroxybutyl vinyl ether/other monomer(s).

Examples of curable CTFE polymer coating materials include Lumiflon produced by Asahi Glass Co., Ltd., FLUONATE produced by DIC Corporation, CEFRAL COAT produced by CENTRAL GLASS Co., Ltd., and ZAFLON produced by TOAGOSEI Co., Ltd.

(3) VdF Polymers Mainly Including Vinylidene Fluoride (VdF) Units

Specific examples thereof include copolymers of VdF/TFE/hydroxybutyl vinyl ether/other monomer(s).

(4) Fluoroalkyl Group-Containing Polymer Mainly Including Fluoroalkyl Units

Specific examples thereof include a copolymer of $CF_3CF_2(CF_2CF_2)_nCH_2CH_2OCOCH$—$CH_2$ (mixture of these with n=3 and 4)/2-hydroxyethyl methacrylate/stearylacrylate.

Examples of the fluoroalkyl group-containing polymer include Unidyne and Ftone produced by Daikin Industries, Ltd., and Zonyl produced by Du Pont.

Among these, perfluoroolefin polymers are preferred in terms of weather resistance and moisture resistance.

The hydroxyl value of the hydroxyl group-containing fluoropolymer is preferably 5 mgKOH/g to 100 mgKOH/g. A hydroxyl value of smaller than 5 mgKOH/g leads to decreased curability, while a hydroxyl value of greater than 100 mgKOH/g leads to decreased solubility in a solvent.

A coating composition including a hydroxyl group-containing fluoropolymer as a coating-film forming component can be prepared as a solvent coating material composition, an aqueous coating composition, or a powder coating composition by a common method. Among these, a solvent coating composition is preferred in terms of easiness in film formation, and excellence in curability and drying properties.

Such a coating composition including a hydroxyl group-containing fluoropolymer as a coating-film forming component according to the present invention preferably contains an isocyanate curing agent as a curing agent, and an organic metal curing aid.

Examples of the isocyanate curing agent include, but not limited to, 2,4-tolylene diisocyanate, diphenylmethane 4,4'-diisocyanate, xylylene diisocyanate, isophorone diisocyanate, lysine methyl ester diisocyanate, methylcyclohexyl diisocyanate, trimethyl hexamethylene diisocyanate, hexamethylene diisocyanate, n-pentane-1,4-diisocyanate, trimers of these compounds, adducts and biurets of these compounds, polymers of these compounds with two or more isocyanate groups, and blocked isocyanates.

The curing aid is not particularly limited as long as it is an organic metal curing aid, and examples thereof include organic titanium curing aids, organic tin curing aids, organic zinc curing aids, organic zirconium curing aids, organic cobalt curing aids, and organic lead curing aids. Among these, at least one selected from the group consisting of organic titanium curing aids, organic zirconium curing aids, and organic zinc curing aids is preferred in terms of dispersibility, stability, and easy availability.

Examples of the organic titanium curing aids include titanium tetraisopropoxide, titanium tetra normal butoxide, titanium butoxide dimer, titanium tetra-2-ethylhexoxide, titanium diisopropoxybis(acetylacetonate), titanium tetraacetylacetonate, titanium dioctyloxybis(octylene glycolate), titanium diisopropoxybis(ethylacetoacetate), titanium diisopropoxybis(triethanolaminate), ammonium salts of titanium lactate, titanium lactate, and polyhydroxy titanium stearate. Examples of the organic zirconium curing aid include zirconium tetra normal propoxide, zirconium tetra normal butoxide, zirconium tetraacetylacetonate, zirconium tributoxy monoacetylacetonate, zirconium monobutoxy acetylacetonate bis(ethylacetoacetate), zirconium dibutoxybis(ethylacetoacetate), zirconium tetra acetylacetonate, and zirconium tributoxy monostearate. Examples of the organic zinc curing aid include zinc acrylate, zinc acetate, zinc citrate, zinc salicylate, zinc oxalate, zinc adipate, zinc carbamate, zinc phthalocyanine, zinc thiolate and zinc stearate, zinc naphthenate, zinc decanoate, zinc butyrate, zinc neodecanoate, zinc isobutyrate, zinc benzoate, zinc octylate, and zinc 2-ethylhexanoate.

The amount of the organic metal curing aid is 0.001 to 10 mmol, preferably 0.01 to 1.0 mmol, and more preferably 0.02 to 0.1 mmol per mole of a —NCO group of the isocyanate curing agent. An amount of less than 0.001 mmol may cause a problem of decreased blocking resistance, while an amount of more than 10 mmol may cause a problem of shortened pot life of the coating composition or coloring of the coating film.

Also, another coating composition for a weather-resistant sheet of a solar cell module according to the present invention preferably contains a pigment. Addition of a pigment is strongly desired in terms of improving the appearance of the solar cell module and protecting the water impermeable sheet from ultraviolet light. Particularly, white pigments such as titanium oxide and calcium carbonate, black pigments such as carbon black, and composite metals such as a Cu—Cr—Mn alloy are usually added.

The coating composition preferably contains 0.80 to 3 parts by mass of the pigment per part by mass of the hydroxyl group-containing fluoropolymer. An amount of smaller than 0.80 parts by mass may increase the UV transmittance and decrease the fire retardancy, while an amount of greater than 3 parts by mass may decrease the dispersibility and adhesion. The lower limit thereof is preferably 0.84 parts by mass, more preferably 1.1 parts by mass, and particularly preferably 1.5 parts by mass. The upper limit thereof is preferably 2 parts by mass.

The pigment and the curing aid are preferably used in combination in terms of increasing the blocking resistance and further increasing the surface hardness. In the case of the combination use, the amounts of the pigment and the curing aid can be in the above respective ranges (0.80 to 3 parts by mass of the pigment per part by mass of the hydroxyl group-containing fluoropolymer, and 0.001 to 10 mmol of the organic metal curing aid per mole of a —NCO group of the isocyanate curing agent). More specifically, the coating composition can include 0.02 to 0.1 mmol of the organic metal curing aid per mole of a —NCO group of the isocyanate curing agent, and not smaller than 0.80 parts by mass and not greater than 2 parts by mass of the pigment per part by mass of the hydroxyl group-containing fluoropolymer.

The hydroxyl group-containing fluoropolymer coating composition can be blended with various additives and resins according to the desired characteristics. Examples of the additives include defoaming agents, leveling agents, UV absorbents, light stabilizers, thickeners, adhesion improvers, matting agents, flame retardants, and pigments. Examples of the resin include acrylic resin, epoxy resin, ABS resin, melamine resin, polyurethane, polyethylene, polystyrene polypropylene, and polyvinyl acetate.

The water impermeable sheet is a layer provided to prevent moisture permeation to EVA (sealant) and the solar cell, and can be produced from any material that substantially does not allow moisture permeation. In respect of weight, price, and flexibility, the following sheets are often used: polyester resin sheets such as polyethylene terephthalate (PET) sheets and polyethylenenaphthalate sheets; polyolefin resin sheets such as polyethylene sheets and polypropylene sheets; polyurethane resin sheets; polycarbonate resin sheets; polyamide resin sheets; polystyrene resin sheets; polyacrylonitrile resin sheets; polyvinyl chloride resin sheets; polyvinyl acetal resin sheets; polyvinyl butyral resin sheets; fluororesin sheets; Si-deposited products of the resin sheets, such as Si-deposited PET sheets; and thin metal sheets such as aluminum sheets and stainless steel sheets. Among these, Si-deposited PET sheets are particularly often used. The thickness of the sheet is usually about 10 to 20 μm.

In order to increase the adhesion, conventionally known surface treatment may be performed. Examples of the surface treatment include corona discharge treatment, plasma discharge treatment, chemical conversion and, in the case of metal sheets, blast treatment.

The cured coating film layer is formed on the water impermeable sheet by applying a coating composition, containing a hydroxyl group-containing fluoropolymer as a coating-film forming component, to at least one surface of the water impermeable sheet depending on the form of the coating material. In this manner, the weather-resistant sheet laminate in the present invention is formed.

The coating may be performed at a temperature in the scope of general coating conditions depending on the form of the composition; in the case of a solvent coating composition, the composition is usually cured into a coating film at a temperature of 10° C. to 300° C., generally at room temperature (20° C. to 30° C.). Therefore, a material on which high-temperature treatment should not be performed, such as a Si-deposited PET sheet, can be used to form the water impermeable sheet without any problem. The curing is usually completed in one minute to three days at 20° C. to 300° C.

The coating composition may be applied to the water impermeable sheet to form a weather-resistant sheet laminate by direct application to the water impermeable sheet or by application to a primer layer on the water impermeable sheet.

The primer layer may be formed by a common method using a conventionally known coating material for a primer. Typical examples of the coating material for a primer include epoxy resin, urethane resin, acrylic resin, silicone resin, and polyester resin.

The thickness of the cured coating film layer is preferably not smaller than 3 μm, more preferably not smaller than 5 μm, and particularly preferably not smaller than 10 μm in terms of concealing properties, weather resistance, chemical resistance, and moisture resistance. The upper limit of the thickness is preferably about 1000 μm, and more preferably 100 μm because a very large thickness may inhibit weight reduction. The thickness is particularly preferably 5 to 40 μm.

The curing and laminating step is described. The curing and laminating step is a step of curing the uncured coating film layer to a crosslinking degree in the range of 80 to 99% to form a laminate of the water impermeable sheet and a cured coating film. With respect to the present invention, the uncured state with a crosslinking degree of 80 to 99% is referred to as a partially cured state.

The rolling step is described. The rolling step is a step of rolling the laminate in the partially cured state. In a pressure-resistance test performed on the weather-resistant sheet for a solar cell module according to the present invention based on JIS K 5600-3-5, a back surface of the water impermeable sheet and a free surface of the cured coating film having a crosslinking degree of 80 to 99% which have come into contact with each other in the rolling step of rolling the laminate are not adhered to each other after a load of 0.08 MPa has been applied to the laminate for 24 hours. The phrase "not adhered" herein means that, as shown in the blocking resistance evaluations in the Examples below, the coating film and the water impermeable sheet are separated naturally or by slight separation force, or are separated by force, leaving slight damage on the surface. In the weather-resistant sheet for a solar cell module according to the present invention, the cured coating film layer has a pencil hardness of not lower than B on the surface thereof when a crosslinking degree of the cured coating film is 80 to 99%. A pencil hardness of lower than B results in insufficient coating film formation, decreasing the blocking resistance.

The production process of the present invention provides an unexpected effect that blocking does not occur even when the crosslinking degree of the cured coating film is 80 to 99%, which indicates an uncured state. The reason that the blocking resistance can be achieved is not clear, but is presumably due to the following mechanism. That is, use of a coating composition such as the above one is deemed to cause a special crosslinking state (e.g., selective crosslinking on the surface) of the curing aid or pigment with the hydroxyl group-containing polymer and the isocyanate curing agent in the resulting cured coating film, which is a different crosslinking state from the conventional one. As is clear from the data of the examples and comparative examples below, the cured coating films in the examples and comparative examples have similar crosslinking degree, which clearly shows that the blocking resistance in the present invention is not achieved by simply accelerating the curing to increase the crosslinking degree.

The aging step is described. The aging step is a step of completely curing the cured coating film of the rolled laminate. Examples of the method of completely curing the cured coating film in this step include a method of curing the cured coating film in a 40° C. furnace for 48 hours or longer.

The coating composition for a weather-resistant sheet of a solar cell module according to the present invention is described below.

The coating composition for a weather-resistant sheet of a solar cell module according to the present invention contains a hydroxyl group-containing fluoropolymer, an isocyanate curing agent, and an organic metal curing aid, and the coating composition contains 0.001 to 10 mmol of the organic metal curing aid per mole of a —NCO group of the isocyanate curing agent. The coating composition contains 0.001 to 10 mmol, preferably 0.01 to 1.0 mmol, and more preferably 0.02 to 0.1 mmol of the organic metal curing aid per mole of a —NCO group of the isocyanate curing agent. An amount of less than 0.001 mmol may cause a problem of decreased blocking resistance, while an amount of more than 10 mmol may cause shortened pot life of the coating composition or coloring of the coating film.

It is preferable that the coating composition for a weather-resistant sheet of a solar cell module according to the present invention contain a hydroxyl group-containing fluoropolymer, an isocyanate curing agent, and a pigment, and the coating composition include 0.80 to 3 parts by mass of the pigment per part by mass of the hydroxyl group-containing fluoropolymer. An amount of smaller than 0.80 parts by mass may increase the UV transmittance and decrease fire retardancy, while an amount of greater than 3 parts by mass may cause a problem of decreased dispersibility and adhesion. The lower limit is preferably 0.84 parts by mass, more preferably 1.1 parts by mass, and particularly preferably 1.5 parts by mass. The upper limit is preferably 2 parts by mass.

The pigment and the curing aid are preferably used in combination in terms of increasing the blocking resistance and further increasing the surface hardness. In the case of the combination use, the amounts of the pigment and the curing aid can be in the above respective ranges (0.80 to 3 parts by mass of the pigment per part by mass of the hydroxyl group-containing fluoropolymer, and 0.001 to 10 mmol of the organic metal curing aid per mole of a —NCO group of the isocyanate curing agent). More specifically, the coating composition can include 0.02 to 0.1 mmol of the organic metal curing aid per mole of a —NCO group of the isocyanate curing agent, and not smaller than 0.80 parts by mass and not greater than 2 parts by mass of the pigment per part by mass of the hydroxyl group-containing fluoropolymer.

The hydroxyl group-containing fluoropolymer, the isocyanate curing agent, the organic metal curing aid, and the pigment may be ones mentioned above in the process for producing a weather-resistant sheet for a solar cell module.

The weather-resistant sheet for a solar cell module according to the present invention is described below.

The weather-resistant sheet for a solar cell module according to the present invention includes, on a water impermeable sheet, a cured coating film layer made of a crosslinked product of a coating composition that includes a hydroxyl group-containing fluoropolymer, wherein in a pressure-resistance test performed based on JIS K 5600-3-5 when a crosslinking degree of the cured coating film layer is 80 to 99%, the cured coating film layer having a crosslinking degree of 80 to 99% and the water impermeable sheet without a cured coating film layer formed thereon are not adhered to each other after a load of 0.08 MPa has been applied for 24 hours to the cured coating film layer and the water impermeable sheet being stacked.

Also, the weather-resistant sheet for a solar cell module according to the present invention includes, on a water impermeable sheet, a cured coating film layer made of a crosslinked product of a coating composition that includes a hydroxyl group-containing fluoropolymer, the cured coating film layer having a pencil hardness of not lower than B on the surface thereof when a crosslinking degree of the cured coating film layer is 80 to 99%.

The hydroxyl group-containing fluoropolymer and the water impermeable sheet may be ones mentioned above in the process for producing a weather-resistant sheet for a solar cell module.

The coating composition for a weather-resistant sheet of the solar cell module according to the present invention contains a hydroxyl group-containing fluoropolymer, an isocyanate curing agent, and an organic metal curing aid, and the coating composition contains 0.001 to 10 mmol of the organic metal curing aid per mole of a —NCO group of the isocyanate curing agent. The coating composition contains 0.001 to 10 mmol, preferably 0.01 to 1.0 mmol, and more preferably 0.02 to 0.1 mmol of the organic metal curing aid per mole of a —NCO group of the isocyanate curing agent. An amount of less than 0.001 mmol may cause a problem of decreased blocking resistance, while an amount of more than 10 mmol may cause shortened pot life of the coating composition or coloring of the coating film.

It is preferable that the coating composition for a weather-resistant sheet of a solar cell module according to the present invention contain a hydroxyl group-containing fluoropolymer, an isocyanate curing agent, and a pigment, and the coating composition include 0.80 to 3 parts by mass of the pigment per part by mass of the hydroxyl group-containing fluoropolymer. An amount of smaller than 0.80 parts by mass may increase the UV transmittance and decrease fire retardancy, and an amount of greater than 3 parts by mass may cause a problem of decreased dispersibility and adhesion. The lower limit is preferably 0.84 parts by mass, more preferably 1.1 parts by mass, and particularly preferably 1.5 parts by mass. The upper limit is preferably 2 parts by mass.

The pigment and the curing aid are preferably used in combination in terms of increasing the blocking resistance and further increasing the surface hardness. In the case of the combination use, the amounts of the pigment and the curing aid are in the above respective ranges (0.80 to 3 parts by mass of the pigment per part by mass of the hydroxyl group-containing fluoropolymer, and 0.001 to 10 mmol of the organic metal curing aid per mole of a —NCO group of the isocyanate curing agent). More specifically, the coating composition can include 0.02 to 0.1 mmol of the organic metal curing aid per mole of a —NCO group of the isocyanate curing agent, and not smaller than 0.80 parts by mass and not greater than 2 parts by mass of the pigment per part by mass of the hydroxyl group-containing fluoropolymer.

The isocyanate curing agent, the organic metal curing aid, and the pigment may be ones mentioned above in the process for producing a weather-resistant sheet for a solar cell module.

The weather-resistant sheet for a solar cell module according to the present invention can be applied to the surface layer of a solar cell module, or to the back surface of a solar cell module.

The solar cell module of the present invention is described below.

The solar cell module of the present invention has a laminate structure of a sealant layer that includes an ethylene/vinyl acetate copolymer and has a solar cell sealed therein, and the above weather-resistant sheet, the solar cell module including the cured coating film layer between the sealant layer and the water impermeable sheet of the weather-resistant sheet.

The solar cell module of the present invention has a laminate structure of a sealant layer that includes an ethylene/vinyl acetate copolymer and has a solar cell sealed therein, and the above weather-resistant sheet, the solar cell module including the water impermeable sheet between the sealant layer and the cured coating film layer of the weather-resistant sheet.

Figure 1:
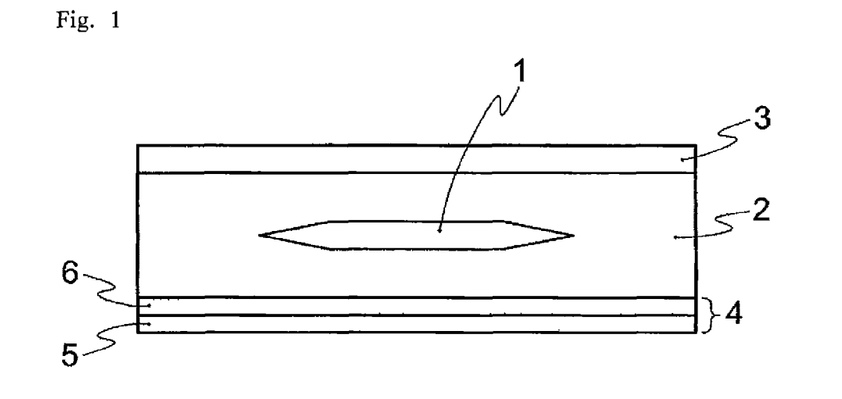
FIG. 1 is a schematic cross-sectional view of a first embodiment of the solar cell module of the present invention.

The solar cell module of the present invention is described based on FIG. 1 that illustrates a preferred embodiment of the solar cell module. Other preferred embodiments of the present invention are illustrated in schematic cross-sectional views in FIGS. 2 to 5.

In FIG. 1, the reference number 1 represents a solar cell sealed in the sealant layer 2 represented by EVA, and the sealant layer 2 is sandwiched by the surface layer 3 and the weather-resistant sheet 4. The weather-resistant sheet 4 includes the water impermeable sheet 5 and a cured coating film layer 6 of a hydroxyl group-containing fluoropolymer coating material. In this first embodiment, the cured coating film layer 6 is formed on the sealant (EVA) layer 2 side.

In this embodiment, the interfacial adhesion is increased especially by co-crosslinking of the cured coating film layer 6 and EVA which are in contact with each other.

Figure 2:
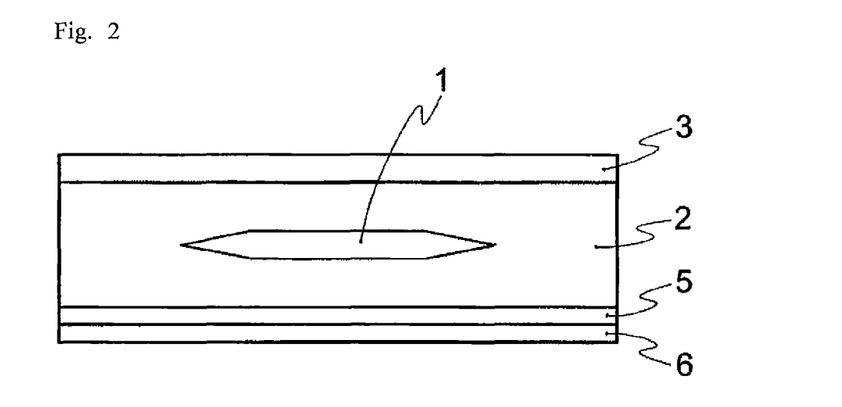
FIG. 2 is a schematic cross-sectional view of a second embodiment of the solar cell module of the present invention.

FIG. 2 illustrates a second embodiment in which the cured coating film layer 6 is disposed on the opposite side of the sealant (EVA) layer 2. In this embodiment, the cured coating film layer 6 contributes to achievement of excellent weather resistance. Here, surface treatment is preferably performed beforehand on the sealant (EVA) layer 2 side surface of the water impermeable sheet 5 in terms of increasing the adhesion. Also, a polyester adhesive, acrylic adhesive, urethane adhesive, or epoxy adhesive may be used as needed.

The weather-resistant sheet of the present invention may have a double-layer structure (FIG. 1, FIG. 2) in which the cured coating film layer 6 is formed only on one surface of the water impermeable sheet 5, or may have a three-layer structure described below.

Figure 3:
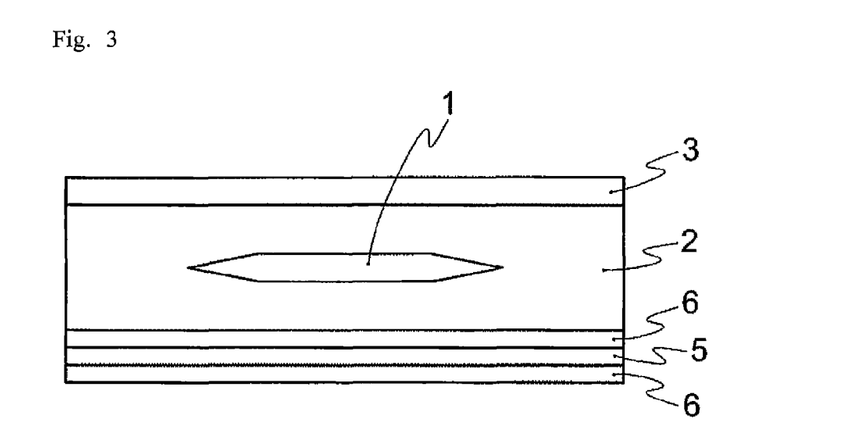
FIG. 3 is a schematic cross-sectional view of a third embodiment of the solar cell module of the present invention.

FIG. 3 illustrates an embodiment (third embodiment) of a weather-resistant sheet having a three-layer structure. The weather-resistant sheet of the third embodiment has a three-layer structure in which the cured coating film layer 6 of a hydroxyl group-containing fluoropolymer is formed on both surfaces of the water impermeable sheet 5.

The third embodiment shows a slight disadvantage in the thickness of the weather-resistant sheet, but has the advantages of the first embodiment and the second embodiment.

The weather-resistant sheet may also have a three-layer structure (FIG. 4, FIG. 5) in which a cured coating film layer of a hydroxyl group-containing fluoropolymer coating material is formed on one surface of the water impermeable sheet, and a cured coating film layer of a fluoropolymer coating material free from curable functional groups, a fluoropolymer sheet, a polyester sheet, or a coating film of a polyester coating material (another sheet or coating film) is formed on the other surface.

A fourth embodiment (FIG. 4) employs a structure formed by disposing another coating film 7 on the opposite side of the sealant (EVA) layer 2 in the first embodiment, and the fifth embodiment (FIG. 5) employs a structure formed by disposing another coating film 7 on the sealant (EVA) 2 side in the second embodiment.

Figure 4:
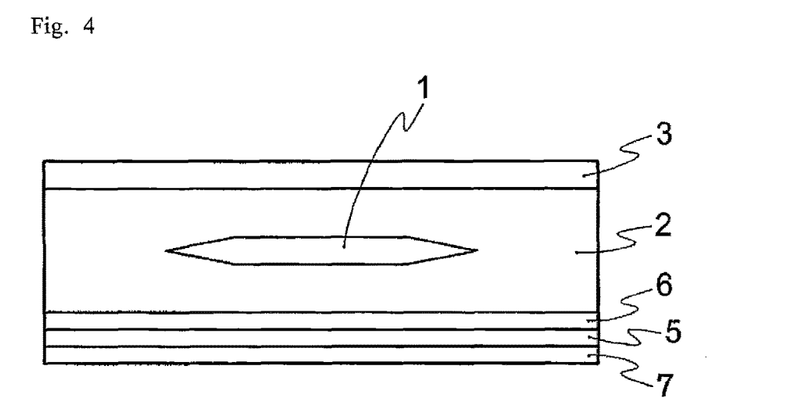
FIG. 4 is a schematic cross-sectional view of a fourth embodiment of the solar cell module of the present invention.
Figure 5:
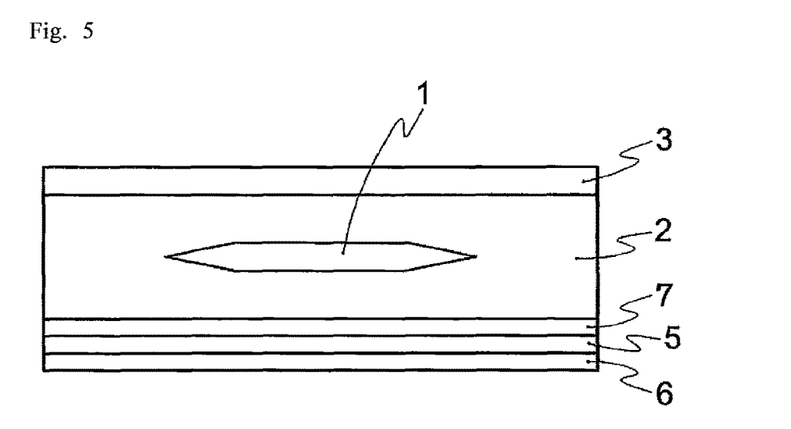
FIG. 5 is a schematic cross-sectional view of a fifth embodiment of the solar cell module of the present invention.

In both of the fourth and fifth embodiments, the material constituting the coating film 7 may be a cured coating film layer of a fluoropolymer coating material free from curable functional groups, a fluoropolymer sheet, a polyester sheet, or a coating film of a polyester coating material.

Examples of the cured coating film layer of the fluoropolymer coating material free from curable functional groups include a cured coating film layer of a coating material described in Patent Document 2 which contains PVdF and tetraalkoxysilane or a partial hydrolysate thereof; a cured coating film layer of a mixed coating material of a VdF/TFE/CTFE copolymer and an alkoxysilane unit-containing acrylic resin; a cured coating film layer of a mixed coating material of a VdF/TFE/HFP copolymer and a hydroxyl group-containing acrylic resin; and a cured coating film layer of a coating material that contains a VdF/HFP copolymer and an amino silane coupling agent. Usually, the thickness of the layer is preferably 5 to 300 µm, more preferably 10 to 100 µm, and particularly preferably 10 to 50 µm in terms of balanced achievement of concealing properties, weather resistance, chemical resistance, and moisture resistance. Also in this case, a primer layer or the like may be disposed between the layers.

Examples of the fluoropolymer sheet include fluoropolymer sheets used for common weather-resistant sheets, such as PVdF sheets, PVF sheets, PCTFE sheets, TFE/HFP/ethylene copolymer sheets, TFE/HFP copolymer (FEP) sheets, TFE/PAVE copolymer (PFA) sheets, ethylene/TFE copolymer (ETFE) sheets, and ethylene/CTFE copolymer (ECTFE) sheets. Usually, the thickness of the sheet is preferably 5 to 300 µm, more preferably 10 to 100 µm, and particularly preferably 10 to 50 µm in terms of good weather resistance.

The polyester sheet may be one used for conventional weather-resistant sheets, and may be bonded to the water impermeable sheet 5 using an acrylic adhesive, urethane adhesive, epoxy adhesive, or polyester adhesive. Usually, the thickness of the sheet is preferably 5 to 300 µm, more preferably 10 to 100 µm, and particularly preferably 10 to 50 µm in terms of good weather resistance, low costs, and good transparency.

Examples of the polyester coating material include a coating material produced from a saturated polyester resin obtained from compounds such as a polycarboxylic acid and a polyalcohol, and a coating material produced from an unsaturated polyester resin obtained from compounds such as maleic anhydride and fumaric acid, and glycols. The coating material can be formed into a coating film by a coating method such as roll coating, curtain coating, spray coating, and die coating. Usually, the thickness of the layer is preferably 5 to 300 µm, more preferably 10 to 100 µm, and particularly preferably 10 to 50 µm in terms of good concealing properties, weather resistance, chemical resistance, and moisture resistance. Also in this case, a primer layer or the like may be disposed between the layers.

The solar panel of the present invention is described below.

The solar panel of the present invention includes the above solar cell module. The solar cell panel may have a structure in which the solar cell modules are arranged vertically, horizontally, or radially in a matrix pattern, or may have any other known structures.

EXAMPLES

The present invention is described based on preparation examples and examples which, however, are not intended to limit the scope of the present invention.

Preparation Example 1

An amount of 202.0 g of a hydroxyl group-containing TFE copolymer composition (ZEFFLE GK570, 65% by mass of a hydroxyl group-containing TFE copolymer), 263.0 g of titanium oxide (D918 produced by Sakai Chemical Industry Co., Ltd.) as a white pigment, and 167.0 g of butyl acetate were preliminary mixed with stirring. To the mixture was added 820 g of glass beads each having a diameter of 1.2 mm, and the pigment was dispersed at 1500 rpm for one hour by a pigment disperser. The glass beads were filtered by a #80 mesh sieve, and the resulting solution was mixed with 283.0 g of the hydroxyl group-containing TFE copolymer composition (ZEFFLE GK570) and 85.0 g of butyl acetate, so that a white coating material was prepared.

To 100 parts by mass of the white coating material, 6.5 parts by mass of an isocyanate curing agent (Sumijule N3300 produced by Sumika Bayer Urethane Co., Ltd.) and 0.004 parts by mass of an organic metal curing aid (Orgatix TC-750 produced by Matsumoto Trading Co., Ltd.) as a curing aid were added such that a curable coating material 1 was prepared. Here, the amount of the pigment was 0.83 parts by mass per part by mass of the hydroxyl group-containing TFE copolymer (hydroxyl group-containing fluoropolymer). The amount of the organic metal curing aid was 0.04 mmol per mole of a —NCO group of the isocyanate curing agent.

Preparation Example 2

An amount of 202.0 g of a hydroxyl group-containing TFE copolymer composition (ZEFFLE GK570), 263.0 g of titanium oxide (D918 produced by Sakai Chemical Industry Co., Ltd.) as a white pigment, and 167.0 g of butyl acetate were preliminary mixed with stirring. To the mixture was added 820 g of glass beads each having a diameter of 1.2 mm, and the pigment was dispersed at 1500 rpm for one hour by a pigment disperser. The glass beads were filtered by a #80 mesh sieve, so that a white coating material was prepared.

To 100 parts by mass of the white coating material, 4.4 parts by mass of an isocyanate curing agent (Sumijule N3300 produced by Sumika Bayer Urethane Co., Ltd.) was added such that a curable coating material 2 was prepared. Here, the amount of the pigment was 2.0 parts by mass per part by mass of the hydroxyl group-containing TFE copolymer (hydroxyl group-containing fluoropolymer).

Preparation Example 3

An amount of 202.0 g of a hydroxyl group-containing TFE copolymer composition (ZEFFLE GK570), 263.0 g of titanium oxide (D918 produced by Sakai Chemical Industry Co., Ltd.) as a white pigment, and 167.0 g of butyl acetate were preliminary mixed with stirring. To the mixture was added 820 g of glass beads each having a diameter of 1.2 mm, and the pigment was dispersed at 1500 rpm for one hour by a pigment disperser. The glass beads were filtered by a #80 mesh sieve, and the resulting solution was mixed with 67.7 g of the hydroxyl group-containing TFE copolymer composition (ZEFFLE GK570) and 30.8 g of butyl acetate, so that a white coating material was prepared.

To 100 parts by mass of the white coating material, 6.5 parts by mass of an isocyanate curing agent (Sumijule N3300 produced by Sumika Bayer Urethane Co., Ltd.) was added such that a curable coating material 3 was prepared. Here, the amount of the pigment was 1.5 parts by mass per part by mass of the hydroxyl group-containing TFE copolymer (hydroxyl group-containing fluoropolymer).

Preparation Example 4

An amount of 202.0 g of a hydroxyl group-containing TFE copolymer composition (ZEFFLE GK570), 393.9 g of titanium oxide (D918 produced by Sakai Chemical Industry Co., Ltd.) as a white pigment, and 279.4 g of butyl acetate were preliminary mixed with stirring. To the mixture was added 820 g of glass beads each having a diameter of 1.2 mm, and the pigment was dispersed at 1500 rpm for one hour by a pigment disperser. The glass beads were filtered by a #80 mesh sieve, so that a white coating material was prepared.

To 100 parts by mass of the white coating material, 6.5 parts by mass of an isocyanate curing agent (Sumijule N3300 produced by Sumika Bayer Urethane Co., Ltd.) was added such that a curable coating material 4 was prepared. Here, the amount of the pigment was 3.0 parts by mass per part by mass of the hydroxyl group-containing TFE copolymer (hydroxyl group-containing fluoropolymer).

Preparation Example 5

An amount of 202.0 g of a hydroxyl group-containing TFE copolymer composition (ZEFFLE GK570), 263.0 g of titanium oxide (D918 produced by Sakai Chemical Industry Co., Ltd.) as a white pigment, and 167.0 g of butyl acetate were preliminary mixed with stirring. To the mixture was added 820 g of glass beads each having a diameter of 1.2 mm, and the pigment was dispersed at 1500 rpm for one hour by a pigment disperser. The glass beads were filtered by a #80 mesh sieve, so that a white coating material was prepared.

To 100 parts by mass of the white coating material, 6.5 parts by mass of an isocyanate curing agent (Sumijule N3300 produced by Sumika Bayer Urethane Co., Ltd.) and 0.004 parts by mass of an organic metal curing aid (Orgatix TC-750 produced by Matsumoto Trading Co., Ltd.) as a curing aid were added such that a curable coating material 5 was prepared. Here, the amount of the pigment was 2.0 parts by mass per part by mass of the hydroxyl group-containing TFE copolymer (hydroxyl group-containing fluoropolymer). The amount of the organic metal curing aid was 0.04 mmol per mole of a —NCO group of the isocyanate curing agent.

Preparation Example 6

An amount of 202.0 g of a hydroxyl group-containing TFE copolymer composition (ZEFFLE GK570), 263.0 g of titanium oxide (D918 produced by Sakai Chemical Industry Co., Ltd.) as a white pigment, and 167.0 g of butyl acetate were preliminary mixed with stirring. To the mixture was added 820 g of glass beads each having a diameter of 1.2 mm, and the pigment was dispersed at 1500 rpm for one hour by a pigment disperser. The glass beads were filtered by a #80 mesh sieve, and the resulting solution was mixed with 283.0 g of the hydroxyl group-containing TFE copolymer composition (ZEFFLE GK570) and 85.0 g of butyl acetate, so that a white coating material was prepared.

To 100 parts by mass of the white coating material, 6.5 parts by mass of an isocyanate curing agent (Sumijule N3300 produced by Sumika Bayer Urethane Co., Ltd.) was added such that a curable coating material 6 was prepared.

Preparation Example 7

An amount of 202.0 g of a hydroxyl group-containing TFE copolymer composition (ZEFFLE GK570), 263.0 g of titanium oxide (D918 produced by Sakai Chemical Industry Co., Ltd.) as a white pigment, and 167.0 g of butyl acetate were preliminary mixed with stirring. To the mixture was added 820 g of glass beads each having a diameter of 1.2 mm, and the pigment was dispersed at 1500 rpm for one hour by a pigment disperser. The glass beads were filtered by a #80 mesh sieve, and the resulting solution was mixed with 283.0 g of a hydroxyl group-containing TFE copolymer composition (ZEFFLE GK570) and 85.0 g of butyl acetate, so that a white coating material was prepared.

To 100 parts by mass of the white coating material, 6.3 parts by mass of an isocyanate curing agent (CORONATE HX produced by Nippon Polyurethane Industry Co., Ltd.) was added such that a curable coating material 7 was prepared.

Example 1

The curable coating material 1 prepared in Preparation Example 1 was applied to one surface of a PET sheet (Lumirror S10 produced by Toray Industries, Inc., 125 μm in thickness, Sheet A) as the water impermeable sheet so that the dried coating film would have a thickness of 5 μm. The curable coating material 1 was dried at 120° C. for two minutes, and thereby a weather-resistant sheet A1 having a double-layer structure was produced.

The blocking resistance (between the coating film and the sheet), the crosslinking degree (coating film), and the pencil hardness (coating film) of the weather-resistant sheet A1 were tested. Also, the curable coating material 1 prepared in Preparation Example 1 was applied to one surface of a PCTFE sheet (DF0025C1 produced by Daikin Industries, LTD., 25 μm in thickness, Sheet B) so that the dried coating film would have a thickness of 5 μm. The curable coating material 1 was dried at 60° C. for 20 minutes, and thereby a weather-resistant sheet B1 having a double-layer structure was produced. The UV transmittance of the weather-resistant sheet B1 was examined. Table 1 shows the results.

Examples 2 to 5 and Comparative Examples 1 and 2

Each of the curable coating materials 2 to 7 prepared in Preparation Examples 2 to 7 was applied to one surface of a PET sheet (Lumirror S10 produced by Toray Industries, Inc., 125 μm in thickness, Sheet A) as the water impermeable sheet so that the dried coating film would have a thickness of 5 μm. The curable coating materials were dried at 120° C. for two minutes, and thereby weather-resistant sheets A2 to A7 each having a double-layer structure were produced.

The blocking resistance (between the coating film and the sheet), the crosslinking degree (coating film), and the pencil hardness (coating film) of each of the weather-resistant sheets A2 to A7 were tested. Each of the curable coating materials 2 to 7 prepared in Preparation Examples 2 to 7 was applied to one surface of a PCTFE sheet (DF0025C1 produced by Daikin Industries, LTD., 25 μm in thickness, Sheet B) so that the dried coating film would have a thickness of 5 μm. The curable coating materials were dried at 60° C. for 20 minutes, and thereby weather-resistant sheets B2 to B7 each having a double layer structure were produced. The UV transmittance of each of the weather-resistant sheets B2 to B7 was examined. Table 1 shows the results.

The test methods and the measuring methods are described below.

(Coating Film Thickness)

The coating film thickness was measured by a micrometer film thickness meter based on JIS C-2151.

(Blocking Resistance)

The blocking resistance was tested based on JIS K 5600-3-5. The prepared coating material was applied to a 50 mm×100 mm PET films, and the coating material was dried under heat in a drier (SPHH-400 produced by ESPEC Corp.) at 120° C. for two minutes. Then, the samples were taken out and left to cool to room temperature. Two samples were sandwiched by glass sheets in such a manner that the coated surface of the one sample and the uncoated surface of the other sample overlap with each other in the area of 50 mm×50 mm. Then, a 20-kg weight was put on the resulting product so that a pressure of 0.08 MPa was applied to the contact surfaces of the films, and the product was maintained in this state at 60° C. for 24 hours. The two films were left to cool to room temperature, and were pulled in the opposite directions to evaluate the blocking resistance. The evaluation was made based on the following criteria: the blocking resistance was evaluated as "+++" if the contact surfaces were separated naturally or by slight separation force; the blocking resistance was evaluated as "++" if the contact surfaces were separated by force, leaving slight damage on the surface; the blocking resistance was evaluated as "+" if the contact surfaces were separated by force, leaving damage on the surface; and the blocking resistance was evaluated as "−" if the contact surfaces could not be separated by force.

(Crosslinking Degree)

The prepared coating material was applied to a polypropylene (hereinafter, PP) plate, and was dried under heat in a drier (SPHH-400 produced by ESPEC Corp.) at 120° C. for two minutes. Then, the PP plate was taken out and left to cool to room temperature, and the coating film was removed from the PP plate. The removed coating film was put into a 50-cc plastic bottle, and 50 cc of acetone was added to the bottle. The mixture was stirred for 24 hours by a mixing rotor, and the residue was collected on a 400-mesh wire cloth. The collected residue was adequately washed with acetone, and then dried under reduced pressure together with the wire cloth. Calculation (%): 100×(weight of residue after drying under reduced pressure)/(weight of coating film removed from PP plate)

(Pencil Hardness)

The pencil hardness was tested based on JIS K 5400.

(UV Transmittance)

The UV transmittance was tested based on JIS K 7105. The transmittance at 180 nm to 500 nm was measured by a spectrophotometer U-4100 produced by Hitachi, Ltd., and the transmittance at 400 nm was taken as the UV transmittance.

TABLE 1

| Coating material composition | Example 1 Preparation Example 1 | Example 2 Preparation Example 2 | Comparative Example 1 Preparation Example 6 | Comparative Example 2 Preparation Example 7 |
|---|---|---|---|---|
| Weather-resistant sheet composition | A1 | A2 | A6 | A7 |
| Coating film layer (μm) | 5 | 5 | 5 | 5 |
| Crosslinking degree (%) | 99 | 98 | 98 | 98 |
| Pencil hardness | HB | B | 2B | 2B |
| Blocking resistance | +++ | ++ | + | − |
| Sheet composition of double-layer structure | B1 | B2 | B6 | B7 |
| UV transmittance (%) | 4.0 | 1.2 | 4.0 | 4.0 |

Table 1 shows that addition of a pigment in Examples 2 to 4 led to a further increase in the pencil hardness and the blocking resistance between the coating film and the sheet compared to Comparative Examples 1 and 2 even though the crosslinking degrees were almost the same. Table 1 also shows that, in Example 1 and Example 5 in which a curing aid was used, the pencil hardness and the blocking resistance between the coating film and the sheet were further improved.

EXPLANATION OF SYMBOLS

1 Solar cell
2 Sealant layer

3 Surface layer
4 Weather resistant sheet
5 Water impermeable sheet
6 Cured coating film layer
7 Sheet or coating film
8, 9 Resin sheet

The invention claimed is:

1. A weather-resistant sheet for a solar cell module, comprising, on a water impermeable sheet, a cured coating film layer made of a crosslinked product of a coating composition that includes a hydroxyl group-containing fluoropolymer, wherein the coating composition contains
a hydroxyl group-containing fluoropolymer having a hydroxyl value of 5 mgKOH/g to 100 mgKOH/g,
an isocyanate curing agent which is at least one selected from the group consisting of xylylene diisocyanate, isophorone diisocyanate, lysine methyl ester diisocyanate, methylcyclohexyl diisocyanate, trimethyl hexamethylene diisocyanate, hexamethylene diisocyanate, n-pentane-1,4-diisocyanate, trimers of these compounds, adducts and biurets of these compounds, polymers of these compounds with two or more isocyanate groups, and blocked isocyanates, and
0.01 to 1.0 mmol of an organic metal curing aid per mole of a —NCO group of the isocyanate curing agent, wherein the organic metal curing aid is an organic titanium curing aid, and
in a pressure-resistance test performed based on JIS K 5600-3-5 when a crosslinking degree of the cured coating film layer is 80 to 99%, the cured coating film layer having a crosslinking degree of 80 to 99% and the water impermeable sheet without a cured coating film layer formed thereon are not adhered to each other after a load of 0.08 MPa has been applied for 24 hours to the cured coating film layer and the water impermeable sheet being stacked.

2. The weather-resistant sheet according to claim 1, the cured coating film layer having a pencil hardness of not lower than B on the surface thereof when a crosslinking degree of the cured coating film layer is 80 to 99%.

3. A solar cell module comprising a laminate structure of a sealant layer that includes an ethylene/vinyl acetate copolymer and has a solar cell sealed therein, and the weather-resistant sheet according to claim 1, the solar cell module including the cured coating film layer between the sealant layer and the water impermeable sheet of the weather-resistant sheet.

4. A solar cell panel comprising the solar cell module according to claim 3.

5. A solar cell module comprising a laminate structure of a sealant layer that includes an ethylene/vinyl acetate copolymer and has a solar cell sealed therein, and the weather-resistant sheet according to claim 1, the solar cell module including the water impermeable sheet between the sealant layer and the cured coating film layer of the weather-resistant sheet.

6. The weather-resistant sheet according to claim 1, wherein the coating composition contains 0.84 to 3 parts by mass of a pigment per part by mass of the hydroxyl group-containing fluoropolymer.

7. A process for producing the weather-resistant sheet for a solar cell module as claimed in claim 1, comprising:
an application step of applying the coating composition to a surface of a water impermeable sheet to form an uncured coating film layer;
a curing and laminating step of curing the uncured coating film layer to a crosslinking degree in the range of 80 to 99% to form a laminate of the water impermeable sheet and the cured coating film;
a rolling step of rolling the laminate; and
an aging step of completely curing the cured coating film of the rolled laminate.

8. The process for producing a weather-resistant sheet for a solar cell module according to claim 7,
wherein
the coating composition contains 0.84 to 3 parts by mass of a pigment per part by mass of the hydroxyl group-containing fluoropolymer.

9. The weather-resistant sheet according to claim 1, wherein the organic titanium curing aid is selected from the group consisting of titanium diisopropoxybis(acetylacetonate), titanium tetraacetylacetonate, titanium dioctyloxybis(octylene glycolate), titanium diisopropoxybis(ethylacetoacetate), titanium diisopropoxybis(triethanolaminate), ammonium salts of titanium lactate, titanium lactate and polyhydroxy titanium stearate.

10. The weather-resistant sheet according to claim 1, wherein the organic titanium curing aid is selected from the group consisting of titanium tetraacetylacetonate, titanium dioctyloxybis(octylene glycolate), titanium diisopropoxybis(ethylacetoacetate), titanium diisopropoxybis(triethanolaminate), ammonium salts of titanium lactate, titanium lactate and polyhydroxy titanium stearate.

* * * * *